Figure 1:
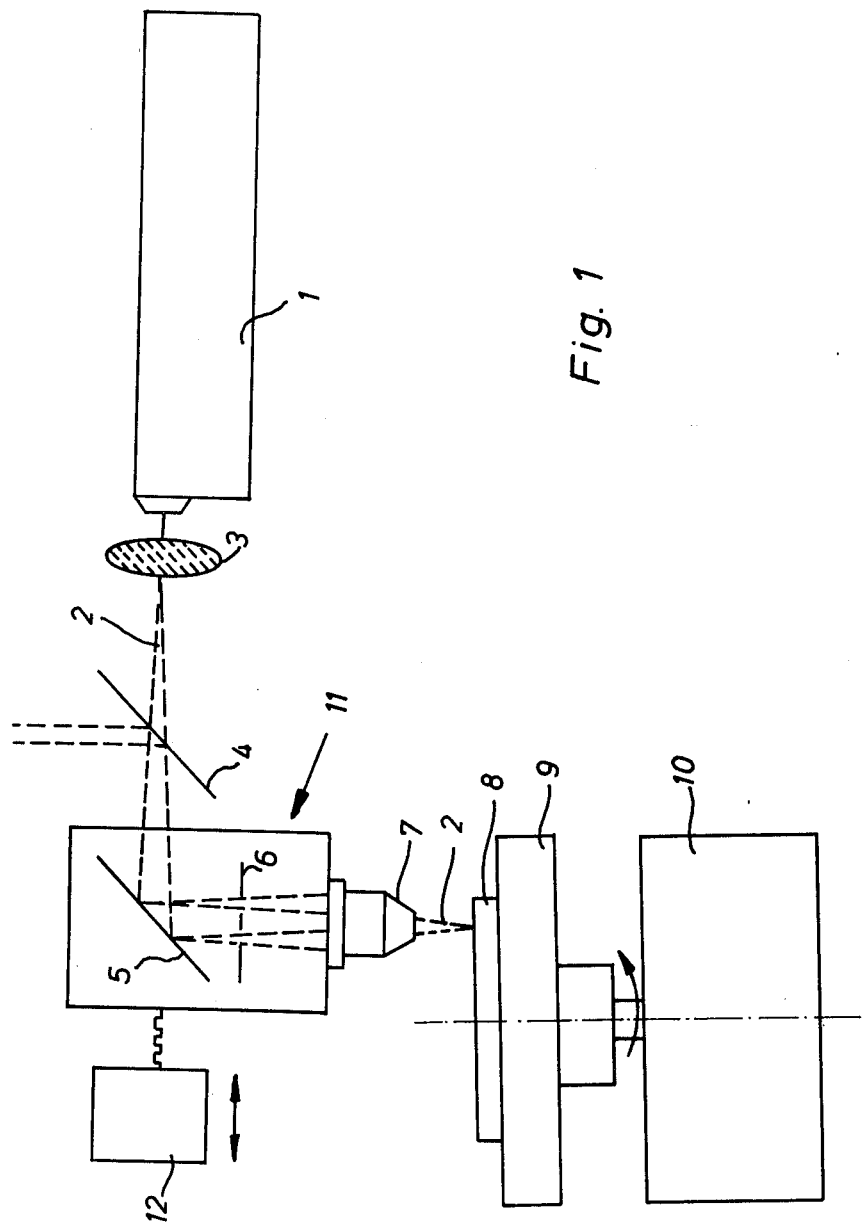

United States Patent [19]

Ghekiere et al.

[11] 4,139,853
[45] Feb. 13, 1979

[54] LASERBEAM RECORDING

[75] Inventors: Jean-Pierre A. Ghekiere, Antwerp; Hugo K. Peeters, Mortsel, both of Belgium

[73] Assignee: AGFA-GEVAERT N.V., Mortsel, Belgium

[21] Appl. No.: 835,737

[22] Filed: Sep. 22, 1977

[30] Foreign Application Priority Data

Sep. 24, 1976 [GB] United Kingdom ............... 39781/76

[51] Int. Cl.$^2$ ...................... G01D 15/10; G01D 15/34
[52] U.S. Cl. ..................................... 346/1; 346/76 L; 346/135
[58] Field of Search .................... 346/76 L, 1, 77, 135

[56] References Cited

U.S. PATENT DOCUMENTS

| 3,262,122 | 7/1966 | Fleisher et al. | 346/76 L |
| 3,475,760 | 10/1969 | Carlson | 346/76 L X |
| 4,023,185 | 5/1977 | Bloom et al. | 346/135 |
| 4,032,691 | 6/1977 | Kido et al. | 346/76 L X |

Primary Examiner—George H. Miller, Jr.
Attorney, Agent, or Firm—William J. Daniel

[57] ABSTRACT

A method of directly forming a light scattering image, wherein a recording layer is information-wise exposed in the visible light spectral region to a light energy dose of at least $10^{-1}$ Ws cm$^{-2}$ with a focussed laser-beam having a beam intensity of at least $10^4$ W cm$^{-2}$. The recording layer is a thermoplastic polymer layer having dissolved therein at least one substance absorbing visible light, which substance imparts a specular density to the recording layer of at least 0.1 with respect to a monochromatic wave of the laser-beam applied in the exposure and is present in an amount of maximum 10% by weight with respect to the thermoplastic polymer of the layer, the recording layer being capable of directly developing in the areas struck by said beam, minute light-scattering centers providing a minimum increase of white light specular density of 0.2 when measured with respect to a transparent background and determined as described hereinbefore, but being incapable of developing such centers when exposed with the same laser-beam at an intensity reduced by a factor of 10.

20 Claims, 1 Drawing Figure

LASERBEAM RECORDING

This invention relates to high intensity laser-beam recording and to materials particularly suited for this purpose.

In J.Micrographics, Vol. 8, No. 6, July (1975) 265-273, thermal high-resolution laser-recording technique termed "heatmode" recording has been described. By definition, heat mode recording includes any process wherein absorbed energy from a laser beam raises the temperature of the recording medium to a point where some detectable physical and/or chemical changes occur, either directly or indirectly through the effect of additional forces.

Several non-silver halide materials have been found to be suitable for heat-mode recording. For example as described in the U.S. Pat. Spec. No. 3,314,073 vacuum-deposited or sputtered metallic films are image-wise evaporated at the areas struck by laser beam radiation of appropriate intensity.

A class of organic materials useful for high intensity laser-beam recording are organic coatings consisting of one or more dyes contained in a plastic binder. Two types of such coatings can be considered here viz. the oblative type in which a dye decolorizes or evaporates by the influence of radiation directed thereon and deformative type wherein the thermoplastic polymer binder layer becomes deformed by the heat energy released by pigments or dyes that have a high absorption at the laser wavelength. One example of the first type of coating containing a very high amount of dye is described, e.g., in the U.S. Pat. Spec. No. 3,465,352, a typical example thereof being a 17% solid solution of a triphenylmethane dye in a cellulose nitrate binder. The second type of said materials is described in the U.S. Pat. Spec. No. 3,475,760. Examples of these materials are thermoplastic binder layers on the basis of vinyltoluene-butadiene, polystyrene-terphenyl, polyethylene or cellulose nitrate in admixture with, e.g., 25% by weight of a nigrosine dye.

An important characteristic of laser heat-mode recording is its capacity to exhibit a "threshold effect". In other words, below a critical energy intensity i.e. power level (Watts/ sq. cm) no recording will occur no matter how long the exposure time lasts, which means that no special procedure to effect stabilization has to be applied. A dry imaging material not working strictly according to the heat-modeprinciple but nonetheless suitable for laser-beam recording can be formed from vesicular films known as KALVAR (trade name) films. In the J. SMPTE Vol. 83 July (1974) 588-599 a laser recording system using a HeCd laser to write on KALVAR (trade name) film has been described. The HeCd laser has an output power of about 10 mW and produces a laser-beam of monochromatic light of wavelength 441.6 nm. The KALVAR (trade name) film contains light-sensitive diazo compounds in a thermoplastic binder, e.g., polyvinyl chloride. During irradiation, minute amounts of nitrogen are split off from the diazo compound. By subsequent overall heating nitrogen expands to microscopic vesicules, which have an index of refraction differing from that of the binder medium and hence act as light-scattering centres (see e.g. Jaromir Kosar "Light-GV.953 PCT sensitive Systems" - John Wiley & Sons, Inc., New York (1965) p. 276-277).

The light-sensitive KALVAR film e.g. KALVAR MIKROLITH 1000 (trade name) film, which is not a strictly speaking, heat-mode recording film, can be handled safely for only a few minutes in normal office illumination prior to or after image exposure. After the image-wise exposure the film has to be heat-developed, but otherwise, it must not be subjected to temperatures above 32° C. for any significant length of time prior to said exposure.

Vesicular images can also be produced in a film material by photodepolymerization of polyketones formed from low-boiling monomers as described in the U.S. Pat. No. Spec. 3,091,,532.

The latent image of monomer released by such depolymerization is developed by subsequent heating of the material at a temperature of from about 120 to about 160° C. to form a vesicular image.

Another film material suggested for vesicular image formation is described in the U.S. Pat. No. Spec. 3,183,091 and essentially consists of a compound, e.g. polyvinylidene chloride, which when exposed to actinic radiation splits off hydrogen halide that enters into reaction with a gas-forming compound e.g. an alkali or alkaline earth carbonate, hydrogen carbonate, oxalate, or tartrate. Recording material of this type is heated after the exposure at 130° C. for 30 s to develop a visible vesicular image.

It is an object of the present invention to provide a laser heat-mode recording method in which real-time images are produced without a separate heat treatment. By the expression "real-time images" is meant that the images are immediately visible upon recording.

It is another object of the present invention to provide a material for laser-beam recording, which need not be handled in a darkroom and is insensitive to the highest intensities of non-focussed sunlight on earth.

It is another object of the present invention to provide recording materials suited for laser heat-mode recording and which have almost infinite storage stability before as well as after stage imaging stage.

It is another object of the present invention to provide a material for laser-beam recording with add-on possibilities in time. By the expression "add-on possibilities" is meant that the recording material after a previous recording procedure remains sensitive to imaging energy to record a further amount of information in addition to the already stored information.

Other objects and advantages will appear from the further description and Examples. The accompanying drawing schematically illustrates one embodiment of a laser beam exposure apparatus for focussing the beam and recording a spiral track on a recording material according to the invention.

In accordance with the present invention a method of directly forming a light-scattering image is provided, wherein a these is exposed information-wise in the visible light range to a light energy dose of at least $10^{-1}$ watt-sec cm$^{-2}$ with a focussed laser-beam having a beam intensity of at least $10^4$ watt cm$^{-2}$ a recording layer of a non-proteinaceous thermoplastic polymer forming a continuous medium having dissolved therein at least one substance substance(s) absorbing visible light, e.g. an organic dye, which substance imports a specular optical density to the recording layer of at least 0.1 with respect to a monochromatic wave of the laser-beam applied in the exposure and is present in an amount of maximum 10% by weight with respect to the thermoplastic polymer of said layer, said recording layer being capable of directly developing in the areas struck by said beam, minute light-scattering centres providing a minimum white light (400-700 nm) specular density of 0.2 measured with respect to a transparent background, by means of an ANSCO (trade name) Automatic Recording Microdensitometer - Model 4 -, with a numerical aperture for the exposure lens of 0.4, the measurement proceeding with the line exposure adjusting microscrew at position 1 and the exposure slot adjusting microscrew set on position 6.

The recording layer does, however, show said light-scattering centres when struck by the same laser-beam at a beam intensity, reduced by a factor of 10.

For the definition of "specular optical density" and its measurement reference is made to C. E. Kenneth Mees and T. H. James - The Theory of the Photographic Process, The Macmillan Company, New York, 3rd Ed. (1969) p.421.

The terms "dissolved" is used above in the sense of molecularly divided in a continuous medium in contrast to "dispersed" which denotes conglomerates of molecules in a surrounding continuous medium.

The present invention includes a recording material having the above-defined properties.

Examples of thermoplastic polymers suited for use in said materials are:

1. - PARLON 300 Cp (PARLON is a trade-name of The Hercules Powder Company, Inc., Wilmington, Del., USA, for a chlorinated rubber). Its glass transition temperature (TG) is 96° C.
2. - LUVISKOL K-90 (LUVISKOL is a trade-name of Badische Anilin- & Soda-Fabrik AG, Ludwigshafen, W. Germany, for a poly-N--vinylpyrrolidone). The TG of the polymer used is 143° C. and the molecular weight 700,000.
3. - Copoly(N-vinylcarbazole/methyl acrylate/β-hydroxyethyl acrylate) having a TG of 96° C. and having the following structure:

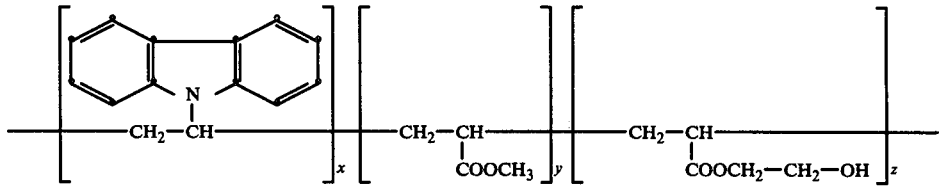

wherein
= 60% by weight
y = 30% by weight
z = 10% by weight.

Said copolymer was prepared as follows:

In a 2-litre reaction flask provided with a stirrer, a condenser, two dropping funnels, and a nitrogen inlet the following substances were introduced and mixed while nitrogen gas bubbled through:
- 800 ml of demineralized water,
- 10 g of HOSTAPON T (trade name of Farbwerke Hoechst AG, Frankfurt (M) - Hochst, W.-Germany, for a wetting agent having the formula:

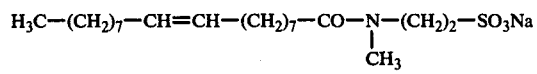

- 120 g of N-vinylcarbazole.

The reaction mixture was heated on a waterbath to 75° C. Subsequently, a mixture of 60 g of methyl acrylate and 20 g of β-hydroxyethyl acrylate was added dropwise in 30 min through one dropping funnel simultaneously with 40 ml of a 2.5% by weight aqueous solution of 4,4'-azo-bis(4-cyanovaleric acid) from the other dropping funnel. The temperature of the reaction mixture rose to 80° C. and some reflux took place. The reaction mixture was kept at 80° C. for 20 min whereupon the temperature was raised to 90° C. and the mixture kept at this temperature for 3 h. It was then stirred overnight and allowed to cool to room temperature. The precipitate formed was sucked off and treated with a mixture of 900 ml of tetrahydrofuran, 900 ml of methanol, and 900 ml of a 5% by weight solution of sodium chloride. The soft copolymer precipitate that became brittle was separated by decantation and washed thrice with water.

The TG of the copolymer obtained is 96° C.

The thermoplastic polymers suited for use in the recording materials of the present invention have preferably a broad molecular weight distribution.

The molecular weight distribution of a polymer can be determined by gel-permeation chromatography. A polymer consists of $n_1, n_2 \ldots n_i$ molecules with molecular mass $M_1, M_2, \ldots M_i \ldots M_N$ respectively. The weight of all the molecules having a molecular mass $M_i$ thus is $\omega_i = n_i M_i$. In order to define the molecular weight distribution the following formula:

$$L = \frac{\overline{M\omega}}{\overline{M_n}}$$

is used, wherein:

$$\overline{M_n} = \frac{\sum\limits_{1}^{N} n_1 M_1}{\sum\limits_{1}^{N} n_1} = \frac{\sum\limits_{1}^{N} \omega_1}{\sum\limits_{1}^{N} \frac{\omega_1}{M_1}} = \frac{100}{\sum\limits_{1}^{N} \frac{\omega_1 \%}{M_1}}$$

This formula represents the molecular mass the polymer would have, if all of the molecules had the same size. The average molecular mass in Mω weight is:

$$\overline{M\omega} = \frac{\sum\limits_{1}^{N} \omega_1 M_1}{\sum\limits_{1}^{N} \omega_1} = \frac{\sum\limits_{1}^{N} \omega_1 \% M_1}{100}$$

L=1 for a monodisperse product and L is the higher the more the polymer is polydisperse. The chlorinated rubber PARLON 300 Cp (trade name) is characterized by L=10.

Organic dyes that have a good photochemical stability are preferred for use in the recording materials of the present invention. Examples of such dyes can be found in the following table with their chemical structure or their name followed by the colour index number (C.I. number).

Table I

| No. | Dye | Pat. ref. or C.I. number |
|---|---|---|
| 1 | [structure] | U.K. Patent Spec. 489,335 |
| 2 | [structure] | Published German Patent Application P2426177.6 |
| 3 | Neozaponorange RE | Solvent Orange 54 CI 11,000 |
| 4 | Sudanrot G | Solvent Red 1 CI 12,150 |
| 5 | Alcovar Orange GC | Solvent Orange 38 CI 11,000 |
| 6 | Rosolsäure | Solvent Dye CI 43,800 |
| 7 | Rouge Feu Savinyl 3 GLS | CI Solvent Red 124 |
| 8 | Orange Tertropigment PG | CI Pigment Orange 13 CI 21,110 |
| 9 | [structure] | Published German Patent Application P2363453.9 |

Among these dyes dye No. 1 is preferred for use in conjunction with an argon ion laser for its absorption maximum is very close to the laser wavelength 514.5 nm viz. at 519 nm.

The concentration of said dye(s) in the recording layer is within the above defined limitations and is normally in the range of 1 to 5% by weight with respect to the polymer(s).

The recording layer is preferably applied to a backing material although self-supporting recording layers are not excluded. Suitable supports are dimensionally stable and include glass plates, metal foils, resin foils and resin plates e.g. of a polyester or polystyrene.

The thickness of the recording layer is in the range of 0.5 to 10 μm, and preferably is 1 to 2 μm.

The recording materials containing a recording layer as defined in the present method are prepared by coating a solution containing at least one suitable thermoplastic polymer and said dye(s) onto a support, to which said coating adheres permanently or removably after drying. Self-supporting recording layers can be produced by stripping the coating from a temporary support.

On writing with the laser-beam the recording materials immediately obtain a track of minute light-scattering centres that correspond with the areas struck by the laser light.

The laser beam is focussed preferably onto the recording layer within a spot of 0.5 to 10 $\mu m^2$, preferably 1 to 4 $\mu m^2$.

In order to obtain a fairly high recording speed i.e. laser-beam writing speed, the recording of the present invention proceeds with a laser having an energy output of preferably at least 100 mW. Such lasers belong e.g. to the class of high-energy gas lasers. A preferred laser for use in the present invention is the argon ion laser having a light output of 1.4 W at 514.5 nm.

A survey of lasers including ion gas lasers having light outputs in the order of watts in the visible spectrum is given by Marce Eleccion in IEEE Spectrum, Mar. 1972, p. 26-40.

The intensity and deflection of laser-beams can be modulated by means well known to those skilled in the art. Since the generation and control of laser-beams are accomplished by apparatus and methods that do not form part of the present invention and that are well known to those skilled in the art, no detailed explanation thereof is given herein.

As the image reproduction is based on the principle of light-scattering, the developed pattern can be used for producing transparencies whose non-transparent areas correspond with the areas exposed to the laser-beam. For projection purposes specular light, i.e. light projected in a narrow angle, is directed towards the imaged recording material. The areas exposed to the laser-beam strongly scatter that light, whereas in the non-exposed areas the light is transmitted without change. In that embodiment the recording layer is coated on a transparent support.

A light-image with reverse image values compared with said transparency can be obtained by putting the recording layer or coating on a black background, e.g. an opaque support or a support coated with a black layer, and directing light towards the layer exposed to the laser-beam. In the black background all specular light passing through the recording layer is absorbed; in the areas exposed to the laser-beam, however, part of the scattered light is reflected toward the observer. Thus, in that embodiment the areas exposed to the laserbeam look bright on a dark background and consequently the image values are reversed compared with transmission exposure.

The following examples illustrate the present invention without, however, limiting it thereto. All ratios and percentages are by weight unless otherwise indicated.

EXAMPLE 1

20 mg of dyestuff No. 4 of the Table were dissolved in 10 ml of a 10% solution of PARLON 300 Cp (trade name) in 1,1,2-trichloroethane.

2 ml of the obtained solution were poured on a glass plate fixed on a turntable rotating at 1000 rev./min. The glass plate had a thickness of 1.7 mm and sized 5 cm × 5 cm. The coating obtained was dried at 25° C.

The dried recording material had a specular optical density of 0.37 at 514.5 nm measured with a UNICAM (trade name) Sp 1800 UV spectrophotometer.

The recording layer was exposed on a turntable to a laser-beam of 514.5 nm emitted by an argon ion laser having an output of 1.4 W at that wavelength. By means of optics the laser-beam was focussed on an area of 4 $\mu m^2$. The recording was performed by writing a spiral track with the laser beam on the recording layer. The writing started at the periphery of the glass plate moving the beam towards the centre, while the turntable was rotated at an angular speed of 2000 rev./min.

The recording material on the turntable had an inclination of 0.3° with the optical axis of the exposure system, so that upon turning of the turntable always a certain track area was exposed in focus.

The exposure technique is illustrated by the accompanying drawing showing a schematic view of the applied apparatus. In the drawing, the laser 1 produces a laser-beam 2 that is focussed with a lens 3. Element 4 represents a semi-transparent mirror (beam-splitter), by means of which the focussing can be checked. A mirror 5 deflects the laser beam through a diaphragm 6 into the microscope objective 7. Through said objective 7 the focussed laser beam 2 strikes the recording material 8 carried on a turntable 9 driven by an electric motor 10. The axis of the turntable makes a small angle (0.3°) with the optical axis of the beam so that in part of the spiral track the beam will be always in focus. The spiral track is obtained by lateral motion of the optical device 11 containing the mirror 5 by means of a driving means 12.

In the focus area the applied laser radiation intensity was $1.25 \times 10^7$ W cm$^{-2}$. The received radiation dose was 12 Ws cm$^{-2}$.

A light-scattering track was produced in the recording material in which the line width was between 1 and 2 $\mu$m and the white light specular density measured with ANSCO (trade name) Automatic Recording Microdensitometer - Model 4 under the conditions described herein was 0.5 above inherent fog.

EXAMPLE 2

Example 1 was repeated except for the replacement of dyestuff no. 4 by 50 mg of dyestuff no. 9 of the table.

The recording material had a specular optical density of 0.87 at 514.5 nm.

The laser-beam writing proceeded likewise as described in Example 1.

A light scattering track having a white light specular density of 0.5 above inherent fog was obtained.

EXAMPLE 3

50 mg of the dyestuff no. 9 of the table were dissolved in 10 ml of a 6% solution of the already mentioned copoly (N-vinylcarbazole/methyl acrylate/hydroxyethyl acrylate) (60/30/10) in 1,1,2-trichloroethane.

The coating proceeded as in Example 1. The recording layer was dried at 25° C. The dried recording material had a specular optical density of 0.69 at 514.5 nm.

The recording proceeded as in Example 1 with the difference, however, that laser-beam writing was carried out at 1000 rev./min. The light dose received was 24 Ws cm$^{-2}$, the laser radiation intensity being the same as in Example 1 viz. $1.25 \times 10^7$ W cm$^{-2}$.

A light-scattering track having a white light specular density of 0.5 above fog was obtained.

EXAMPLE 4

50 mg of dyestuff no. 3 of the table were dissolved in 10 ml of a 10% solution in non-anhydrous ethanol (4% water) of LUVISKOL K-90 (trade name).

The coating proceeded as in Example 1. The recording layer was dried at 25° C. It had a specular optical density of 0.4 at 476 nm.

The recording layer was exposed as described in Example 1 with the difference, however, that a laser-beam of 476 nm with an energy of 100 mW was used and the turntable rotated at 1200 rev./min. The light dose received by the recording layer was 2 Ws cm$^{-2}$, the beam intensity being $1.25 \times 10^6$ W cm$^{-2}$.

A light-scattering track having a white light specular density of 0.5 above inherent fog was obtained.

EXAMPLE 5

The coating of a coloured latex prepared as described hereinafter proceeded as in Example 1. The recording layer was dried at 25° C. The dried recording material had a specular optical density of 0.2 at 514.5 nm.

Laser-beam writing proceeded as in Example 1 with the difference, however, that the turntable was rotated at only 500 rev./min, so that the exposure dose was 50 Ws cm$^{-2}$.

A light-scattering track as in the preceding Examples was obtained.

PREPARATION OF THE COLOURED LATEX 25 g of Rouge Feu Savinyl 3 GLS (C. I. Solvent Red 124) were added to a mixture of 200 g of ethyl acrylate and 50 g of methyl methacrylate. Non-dissolved dye was removed by filtration and to the obtained dye solution further amounts of 200 g of ethyl acrylate and 50 g of methyl methacrylate were added. The mixture obtained was called mixture A.

250 ml of a 2% by weight solution of potassium persulphate in water was prepared and called mixture B.

A solution of 575 ml of water and 250 ml of a 10% by weight solution of sodium oleylmethyltauride was heated to 72° C.

To this solution ¼ of mixture A was added at once with stirring and the temperature was allowed to drop to 70° C. Subsequently, ¼ of mixture B was added. The temperature rose to 73° C. in 5 min. Next, ¾ of A and 2/4 of B were added gradually in 25 min. The temperature reached 90° C. 95 min after the addition of said portion the remaining ¼ of mixture B was added and stirring was continued for 2 h while the temperature was maintained at 90° C. The polymerisation was completed within a further 30 min at 95° C.

EXAMPLE 6

50 mg of dyestuff no. 6 of the table were dissolved in 10 ml of a solution of LUVISKOL K-90 (trade name) in ethanol containing 4% of water. Said solution had a polymer concentration corresponding with a viscosity of 50 mPa.s at 20° C.

The coating proceeded as in Example 1. The recording layer was dried at 25 ° C.

The dried recording layer had a specular optical density of 0.1 at 488 nm.

Laser-beam recording proceeded as described in Example 1 with the difference, however, that laser light of 488 nm was used. The applied light dose was 12 Ws cm$^{-2}$.

The beam intensity was $1.25 \times 10^7$ W cm$^{-2}$. The writing with the laser beam proceeded at 2000 rev./min of the turntable.

A light scattering track with a white light specular density of 0.5 above inherent fog was obtained.

EXAMPLE 7

50 mg of pigment dyestuff no. 8 of the table were dispersed in 10 ml of a 10% solution of PARLON 300 Cp (trade name) in 1,1,2-trichloroethane, said solution having a viscosity of 46 mPa.s at 20° C.

Coating and drying proceeded as in Example 1.

The dried recording layer had a specular optical density of 0.30 at 514.5 nm.

Laser-beam recording proceeded as described in Example 1 with the difference, however, that writing with the laser beam proceeded at 1000 rev./min of the turntable.

The light dose applied was 24 Ws cm$^{-2}$. The beam intensity was as described in Example 1.

A light-scattering track as in Example 1 was obtained.

In connection with the preceding Examples it has to be noticed that when the laser beam intensity was reduced in each Example by a factor 10, no light scattering track was obtained anymore.

EXAMPLE 8

25 mg of dyestuff No. 1 of the Table were dissolved in 10 ml of a 10% solution of PARLON 300 Cp (trade name) in 1,1,2-trichloroethane. The obtained solution was applied with a wet layer thickness of 0.05 mm to a black bismuth layer carried by a polyethylene terephthalate sheet. The coating obtained was dried at 25° C.

The bismuth layer had been applied by vapour deposition under reduced pressure to the polyethylene terephthalate sheet of 0.1 mm thickness. The bismuth layer had a thickness of 150 nm and an optical density above 4.

After laser-beam exposure as described in Example 1 the resultant light reflection differentiation between the areas exposed to the laser-beam (the spiral track) and the non-exposed areas was measured with specular light by means of the ANSCO (trade name) microdensitometer having a numerical aperture of 0.4.

In the background areas the reflection optical density was 1.5 and in the track areas having a width of 3.5 μm the reflection optical density was only 0.5.

We claim:

1. A method of directly forming a light scattering image, comprising the steps of: information-wise exposing in the visible light range to a light energy dose of at least $10^{-1}$ Ws cm$^{-2}$ with a focussed laser-beam having a beam intensity of at least $10^4$ W cm$^{-2}$ a recording layer of a non-proteinaceous thermoplastic polymer layer forming a continuous medium and having dissolved therein at least one substance absorbing visible light, such substance imparting a specular density to said recording layer of at least 0.1 with respect to a monochromatic wave of the laser-beam applied in the exposure and being present in an amount of maximum 10% by weight with respect to thermoplastic polymer(s) of said layer, said recording layer being capable of directly developing in the areas struck by said beam, minute light scattering centres providing a minimum increase of white light specular density of 0.2 when measured with respect to a transparent background and determined as described hereinbefore, and being incapable of developing such centres when exposed with the same laser-beam at an intensity reduced by a factor of 10.

2. A method according to claim 1, wherein the substance absorbing visible light is an organic dye.

3. A method according to claim 1, wherein the thermoplastic polymer is a chlorinated rubber having a glass transition temperature of 96° C.

4. A method according to claim 1, wherein the thermoplastic polymer is a poly-N-vinylpyrrolidone having a glass transition temperature of 143° C.

5. A method according to claim 1, wherein the thermoplastic polymer has the following structure:

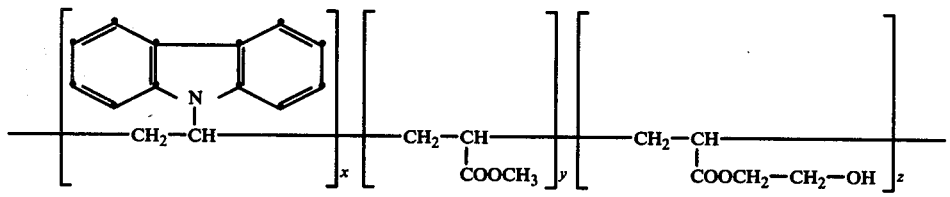

wherein
x = 60% by weight
y = 30% by weight
z = 10% by weight and has a glass transition temperature of 96° C.

6. A method according to claim 1, wherein the recording layer contains an organic dye selected from those listed in Table I of the specification as said light-absorbing substance.

7. A method according to claim 1, wherein the recording layer contains said substance said polymer absorbing visible light in a concentration in the range of 1 to 5% by weight with respect to said polymer.

8. A method according to claim 1, wherein said layer is carried by a transparent support.

9. A method according to claim 1, wherein said layer is carried by an opaque support.

10. A method according to claim 1, wherein said layer has a thickness in the range of 0.5 to 10 μm.

11. A method according to claim 1, wherein the laser-beam is focussed on the recording layer within a spot of 0.5 to 10 μm².

12. A method according to claim 1, wherein the laser-beam is produced by an argon ion laser having a light output at 514.5 nm.

13. A recording material suited for directly producing a light-scattering image, comprising a recording layer of a non-proteinaceous thermoplastic polymer layer forming a continuous medium and having dissolved therein at least one substance absorbing visible light which imparts to the layer a specular optical density of at least 0.1 with respect to a monochromatic wave of a laser-beam absorbed by said substance and is present in an amount of maximum 10% by weight with respect to thermoplastic polymer of said layer, said layer being capable of directly developing light-scattering centres providing a minimum increase of white light specular density of 0.2 when measured with respect to a transparent background and determined as described hereinbefore when exposed to a light energy dose of at least $10^{-1}$ Ws cm$^{-2}$ with a focussed laser-beam that is absorbed by said substance absorbing visible light and has a beam intensity of at least $10^4$ W cm$^{-2}$, but being incapable of developing such centres when exposed to the same laser-beam at an intensity reduced by a factor of 10.

14. A material according to claim 13, wherein the thermoplastic polymer is a chlorinated rubber having a glass transition temperature of 96° C.

15. A material according to claim 13, wherein the thermoplastic polymer is a poly-N-vinylpyrrolidone having a glass transition temperature of 143° C.

16. A material according to claim 13, wherein the thermoplastic polymer has the following structure:

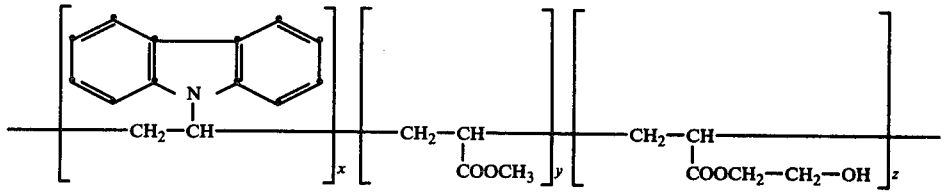

wherein
x = 60% by weight
y = 30% by weight
z = 10% by weight and has a glass transition temperature of 96° C.

17. A material according to claim 13, wherein said layer is carried by a transparent or opaque support.

18. A material according to claim 13, wherein said layer has a thickness in the range of 0.5 to 10 μm.

19. A material according to claim 13, wherein the substance absorbing visible light is an organic dye.

20. A material according to claim 19, wherein the recording layer contains said dye in a concentration in the range of 1 to 5% by weight with respect to the polymer(s).

* * * * *